(12) United States Patent
Park et al.

(10) Patent No.: US 8,883,296 B2
(45) Date of Patent: Nov. 11, 2014

(54) COATING STRUCTURE AND METHOD FOR FORMING THE SAME

(75) Inventors: Byung Ha Park, Suwon-si (KR); Sang Ho Cho, Ansan-si (KR); Myung Gon Kim, Hwaseong-si (KR); Ki Yong Song, Seoul (KR); Cheol Ham, Yongin-si (KR); In Oh Hwang, Seongnam-si (KR)

(73) Assignee: Samsung Electro-Mechanics Co., Ltd., Suwon-Si (KR)

( * ) Notice: Subject to any disclaimer, the term of this patent is extended or adjusted under 35 U.S.C. 154(b) by 228 days.

(21) Appl. No.: 13/371,825

(22) Filed: Feb. 13, 2012

(65) Prior Publication Data
US 2013/0143017 A1     Jun. 6, 2013

(30) Foreign Application Priority Data

Dec. 5, 2011 (KR) .................. 10-2011-0128854

(51) Int. Cl.
*B32B 7/02* (2006.01)
*B32B 3/00* (2006.01)
*B32B 9/04* (2006.01)
*C23C 16/22* (2006.01)

(52) U.S. Cl.
USPC ........... 428/216; 428/446; 428/336; 428/447; 427/255.7

(58) Field of Classification Search
USPC .............. 428/216, 446, 336, 447; 427/255.7; 106/287.12, 287.14
See application file for complete search history.

(56) References Cited

U.S. PATENT DOCUMENTS

2012/0019915 A1\*  1/2012  Yan et al. ............... 359/586
2012/0174823 A1\*  7/2012  Ham et al. ............ 106/287.14

FOREIGN PATENT DOCUMENTS

JP  2001-74931  3/2001
JP  2011-68000  4/2011

OTHER PUBLICATIONS

STIC Structure Search Report; Jan. 24, 2014.\*
Extended European Search Report mailed Mar. 6, 2013 for corresponding European Application No. 12161042.2.

\* cited by examiner

*Primary Examiner* — Aaron Austin
*Assistant Examiner* — Tahseen N Khan
(74) *Attorney, Agent, or Firm* — Staas & Halsey LLP

(57) ABSTRACT

A coating structure and a method for forming the same where, by forming an aluminum oxide layer and a silicon dioxide layer between a product to be coated and a coating layer, durability, reliability and anti-corrosion of the coating layer can be improved and furthermore, product yield can also be improved. The coating structure formed on the surface of a product includes an aluminum oxide ($Al_2O_3$) layer formed on the surface of the product, a silicon dioxide ($SiO_2$) layer formed on the surface of the aluminum oxide ($Al_2O_3$) layer, and a coating composition layer formed on the silicon dioxide ($SiO_2$) layer.

11 Claims, 14 Drawing Sheets

FIG. 1 – Related Art

COATING STRUCTURE AND METHOD FOR FORMING THE SAME

CROSS-REFERENCE TO RELATED APPLICATIONS

This application claims the benefit of Korean Application No. 10-2011-0128854, filed Dec. 5, 2011, in the Korean Intellectual Property Office, the disclosure of which is incorporated herein by reference.

BACKGROUND

1. Field

Embodiments of the present disclosure relate to an anti-fingerprint coating structure with superior durability and anti-corrosion, and a method for forming the same.

2. Description of the Related Art

The surfaces of displays of electronic products, for example, screens of TVs, screens of PC or notebook monitors, screens of mobile equipment such as cellular phones or PDAs, or touch panels of electronic products are readily stained with fingerprints or components of the face such as lipids or proteins and are thus remarkably visible to the naked eye and appear dirty when coming in contact with the hands or face of users during calling.

Accordingly, a method in which an anti-fingerprint coating layer is formed by forming a waterproof and oilproof fluorine-containing thin film on the surface of displays or coating the surface of displays with a waterproof silicone resin skeleton is incorporated.

As a method for forming an anti-fingerprint coating layer, anti-fingerprint (AF) coating is generally used. AF coating is a method in which a coating layer is formed on the surface of a panel by spraying or deposition to ease cleaning and slip sensation.

In order to improve wear resistance of AF coating layers, titanium dioxide (TiO2) or silicon dioxide (SiO2) is deposited on the surface of products to be coated and an AF coating layer is then formed thereon. However, in a case in which only a silicon dioxide layer is used between the surface of products and the AF coating layer, the silicon dioxide layer used for a long period of time is corroded with salt water and actual lifespan of the AF coating layer may be disadvantageously shortened.

In addition, AF coating layers of the related art neither prevent adhesion of lipids, the main component of fingerprints, nor hide fingerprints present on product surfaces, nor do they enable the fingerprints to be cleaned well. For this reason, fingerprints present on product surfaces may be readily visible and appear to be dirty.

SUMMARY

Additional aspects' and/or advantages will be set forth in part in the description which follows and, in part, will be apparent from the description, or may be learned by practice of the disclosure.

Therefore, it is an aspect of the present disclosure to provide a coating structure in which durability, reliability and anti-corrosion of a coating layer and product yield can be improved by forming an aluminum oxide layer and a silicon dioxide layer between the product to be coated and the coating layer, and a method for forming the same.

In accordance with one aspect of the present disclosure, a coating structure formed on the surface of a product includes: an aluminum oxide ($Al_2O_3$) layer formed on the surface of the product; a silicon dioxide ($SiO_2$) layer formed on the surface of the aluminum oxide ($Al_2O_3$) layer; and a coating composition layer formed on the silicon dioxide ($SiO_2$) layer.

The aluminum oxide ($Al_2O_3$) layer may have a thickness of about 50 Å to about 400 Å.

The aluminum oxide ($Al_2O_3$) layer may have a thickness of about 100 Å to about 200 Å.

The silicon dioxide ($SiO_2$) Layer may have a thickness of about 100 Å to about 200 Å.

The coating composition may contain: a silane oligomer having an $R_1$ group represented by Formula 1 of $[R_aO—(CH_2CH_2O)_p—R_b—]$ wherein $R_a$ is selected from the group consisting of hydrogen and an alkyl group having 1 to 3 carbon atoms; $R_b$ is selected from the group consisting of an alkyl group having 5 to 20 carbon atoms, an alkenyl group having 5 to 20 carbon atoms, an alkynyl group having 5 to 20 carbon atoms, an aryl group having 5 to 20 carbon atoms, an arylalkyl group having 6 to 20 carbon atoms, a cycloalkyl group having 5 to 20 carbon atoms and a heteroalkyl group having 5 to 20 carbon atoms; and p is an integer of 1 to 12; and an $R_2$ group represented by Formula 2 of $(R_c)_q$ wherein $R_c$ is a cycloalkyl group having 3 to 20 carbon atoms; and q is an integer of 1 to 3.

The $R_1$ group may be at least one selected from the group consisting of a methoxyethoxyundecyl group, a methoxytriglycoloxy-undecyl group, a 3-methoxyethoxy-4-acetoxycyclohexylethyl group, a 16-(2-methoxy-ethoxy)hexadecyl group and derivatives thereof.

The $R_2$ group may be at least one selected from the group consisting of a 3-cyclopentadienylpropyl group, a dicyclopentyl group, a cyclopentyl group, a cyclohexyl group, a cyclooctyl group and derivatives thereof.

The silane oligomer may have a structure of Formula 3 below.

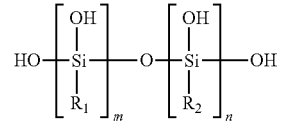

Formula 3 wherein m and n are each independently integers of 1 to 10.

In accordance with another aspect of the present disclosure, provided is a device provided at the surface thereof with a coating structure wherein the coating structure includes: an aluminum oxide ($Al_2O_3$) layer formed on the surface of the device; a silicon dioxide ($SiO_2$) layer formed on the surface of the aluminum oxide ($Al_2O_3$) layer; and a coating composition layer formed on the silicon dioxide ($SiO_2$) layer.

The aluminum oxide ($Al_2O_3$) layer may have a thickness of about 50 Å to about 400 Å.

The aluminum oxide ($Al_2O_3$) layer may have a thickness of about 100 Å to about 200 Å.

The silicon dioxide ($SiO_2$) layer may have a thickness of about 100 Å to about 200 Å.

In accordance with yet another aspect of the present disclosure, a method for forming a coating structure on the surface of a product, includes: forming an aluminum oxide ($Al_2O_3$) layer on the surface of the device; forming a silicon dioxide ($SiO_2$) layer on the surface of the aluminum oxide ($Al_2O_3$) layer; and forming a coating composition layer on the silicon dioxide ($SiO_2$) layer.

The formation of the aluminum oxide ($Al_2O_3$) layer, the formation of the silicon dioxide ($SiO_2$) layer, and the formation of the coating composition layer may be carried out by vacuum deposition.

The silicon dioxide (SiO$_2$) layer may have a thickness of about 100 Å to about 200 Å.

The aluminum oxide (Al$_2$O$_3$) layer may have a thickness of about 100 Å to about 200 Å.

The coating composition may contain: a silane oligomer having an R$_1$ group represented by Formula 1 of [R$_a$O—(CH$_2$CH$_2$O)$_p$—R$_b$—] wherein R$_a$ is selected from the group consisting of hydrogen and an alkyl group having 1 to 3 carbon atoms; R$_b$ is selected from the group consisting of an alkyl group having 5 to 20 carbon atoms, an alkenyl group having 5 to 20 carbon atoms, an alkynyl group having 5 to 20 carbon atoms, an aryl group having 5 to 20 carbon atoms, an arylalkyl group having 6 to 20 carbon atoms, a cycloalkyl group having 5 to 20 carbon atoms and a heteroalkyl group having 5 to 20 carbon atoms; and p is an integer of 1 to 12; and an R$_2$ group represented by Formula 2 of (R$_c$)$_q$ wherein R$_c$ is a cycloalkyl group having 3 to 20 carbon atoms; and q is an integer of 1 to 3.

According to the coating structure and the method for forming the same of one aspect of the present disclosure, by forming an aluminum oxide layer and a silicon dioxide layer between a product to be coated and a coating layer, durability, reliability and anti-corrosion of the coating layer can be improved and furthermore, product yield can also be improved.

In addition, by using an invisible fingerprint (IF) coating layer, lipid components of fingerprints left on the surface of the coating layer broadly spread on the surface and stains by the fingerprints are not remarkable.

BRIEF DESCRIPTION OF THE DRAWINGS

The patent or application file contains at least one drawing executed in color. Copies of this patent or patent application publication with color drawings will be provided by the Office upon request and payment of the necessary fee. These and/or other aspects of the disclosure will become apparent and more readily appreciated from the following description of the embodiments, taken in conjunction with the accompanying drawings of which.

DETAILED DESCRIPTION

Figure 1:
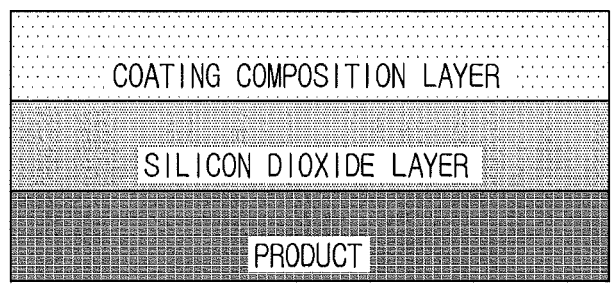
FIG. 1 is a sectional view schematically illustrating a coating structure formed on the surface of a product by a method of the related art.

Reference will now be made in detail to the embodiments of the present disclosure, examples of which are illustrated in the accompanying drawings, wherein like reference numerals refer to the like elements throughout.

FIG. 1 is a sectional view schematically illustrating a coating structure formed on the surface of a product by a method of the related art.

Referring to FIG. 1, in the related art, a silicon dioxide (SiO$_2$) layer is coated on the surface of a product and a coating composition layer is then coated thereon to form a coating structure to protect the product surface and prevent fingerprints from being left thereon.

The coating of silicon dioxide layer aims to improve durability or wear resistance through bonding between the coating composition layer and the silicon dioxide layer. However, in a case in which the silicon dioxide layer is directly formed on the product surface, corrosion caused by salt water occurs and the effects of the coating composition layer cannot be maintained.

Figure 2:
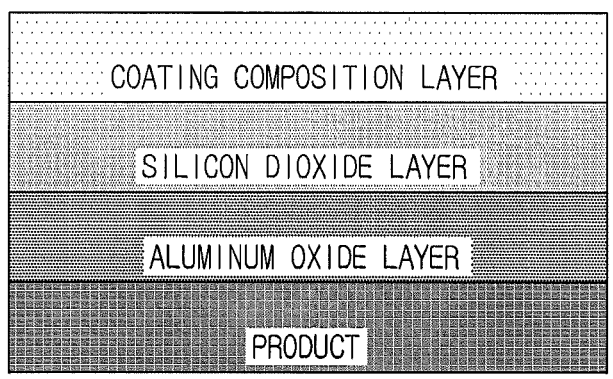
FIG. 2 is a sectional view schematically illustrating a coating structure according to one embodiment of the present disclosure.

FIG. 2 is a sectional view schematically illustrating a coating structure 100 according to one embodiment of the present disclosure.

Referring to FIG. 2, the coating structure according to one embodiment of the present disclosure includes an aluminum oxide layer (Al$_2$O$_3$) formed on the surface of a product to be coated, a silicon dioxide layer (SiO$_2$) formed on the aluminum oxide layer and a coating composition layer (hereinafter, also called "coating layer") formed on the silicon dioxide layer.

The coating composition used for embodiments of the present disclosure may be any of a variety of coating compositions that are utilized in various applications including surface protection of products, prevention of adhesion of foreign materials and concealing of fingerprints. In the following embodiments, an anti-fingerprint coating composition is mainly used for convenience of description, but the coating layer used for embodiments of the present disclosure is not limited to the anti-fingerprint coating layer.

In addition, examples of the product to be coated include, but are not limited to, mobile equipment such as cellular phones or PDAs or displays such as TVs and computer monitors. Any product may be used without particular limitation so long as foreign materials such as fingerprints of users may be stuck to the surface thereof or a coating layer may be formed on the surface thereof.

In addition, the surface of products on which the coating structure is formed includes, but is not limited to, surfaces of touch screens provided in the products or surfaces of displays such as LCDs and LEDs. Any surface of products may be used without particular limitation so long as foreign materials such as fingerprints of users may be stuck to the surface thereof or a coating layer may be formed on the surface thereof.

Aluminum oxide exhibits high strength, high hardness, wear resistance, corrosion resistance and the like and has low preparation temperature and short preparation time, and the size and structure thereof can thus be readily controlled. However, as the thickness of aluminum oxide increases, reflectance thereof increases, since aluminum oxide has a high index of refraction of about 1.76 to about 1.77.

Figure 3:
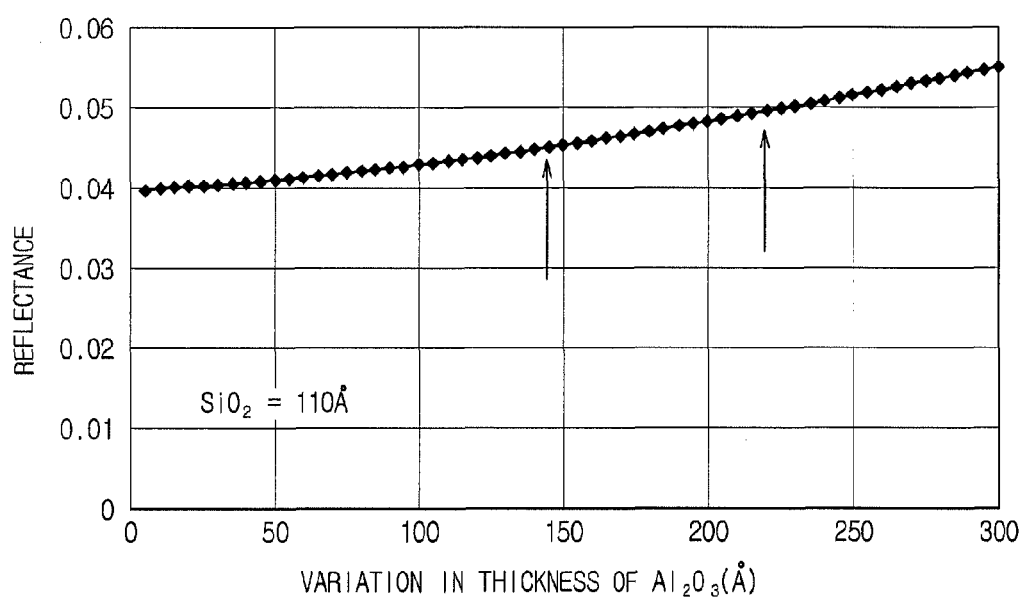
FIG. 3 is a graph showing variation in reflectance with variation in thickness of an aluminum oxide layer.

FIG. 3 is a graph showing variation in reflectance with variation in thickness of an aluminum oxide layer.

The graph of FIG. 3 is obtained by coating a silicon dioxide layer on an aluminum oxide layer to form a coating structure and measuring reflectance with variation in thickness of the aluminum oxide layer. The thickness of the silicon dioxide layer is 110 Å.

As shown in FIG. 3, as the thickness of the aluminum oxide increases, reflectance of the coating structure also increases. As reflectance increases, eye fatigue of users becomes serious, and resolution is also deteriorated and furthermore, overall image quality may be deteriorated when the product provided with a coating structure is a display device.

Accordingly, suitable control of thickness of aluminum oxide is required. When the thickness of the aluminum oxide layer is less than 50 Å, reflectance is not high. However, the thickness of the aluminum oxide layer is preferably adjusted to 50 Å or more in order to improve wear resistance and anti-corrosion of the coating structure.

In one embodiment of the present disclosure, when taking into consideration both reflectance and durability of the coating structure, the thickness of aluminum oxide layer may be adjusted to 50 Å to 400 Å. When the thickness of the aluminum oxide layer is 100 Å to 200 Å, a coating structure that exhibits superior reflectance and durability can be obtained. Also, the thickness of the silicon dioxide layer may be 100 Å to 200 Å, but is not limited thereto. A designer may determine a suitable thickness through experimentation.

Figure 4A:
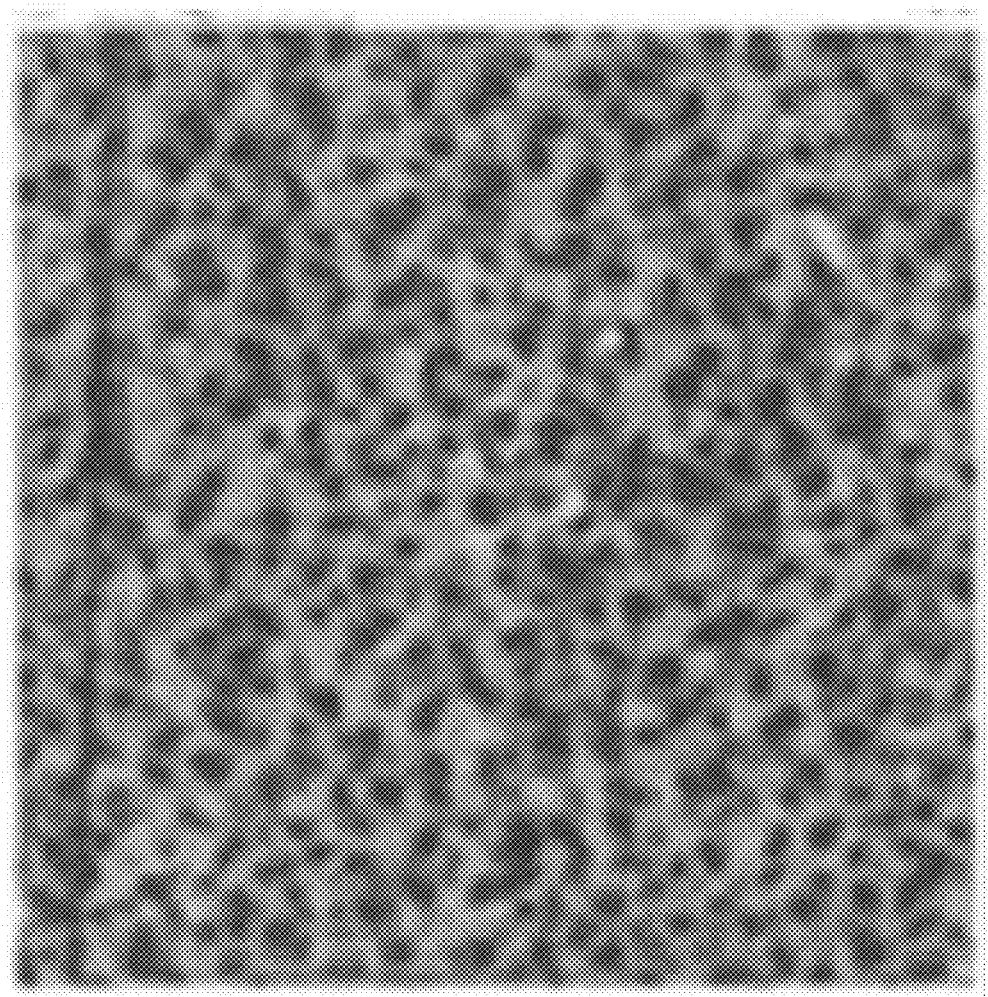
FIG. 4A is an image showing the surface morphology of a silicon dioxide-layer.
Figure 4B:
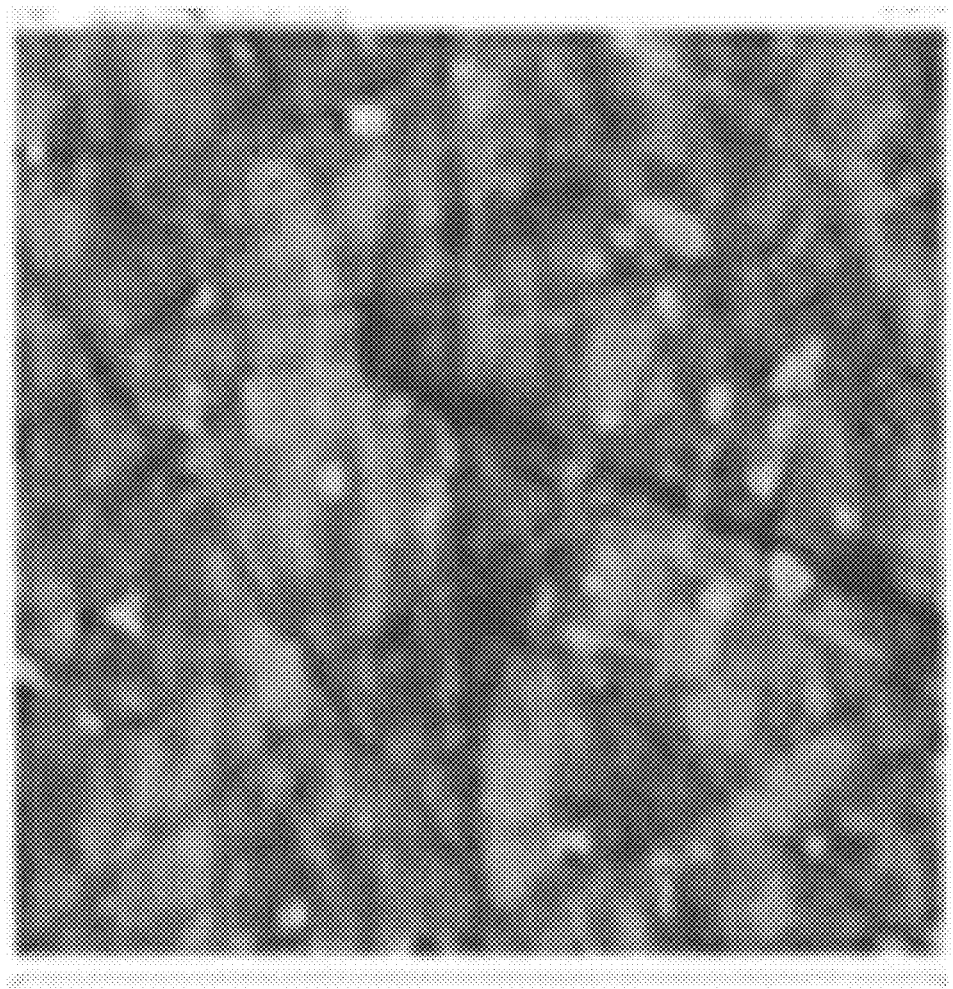
FIG. 4B is an image showing the surface morphology of a silicon dioxide layer formed on an aluminum oxide layer.

FIG. 4A is an image showing the surface morphology of a silicon dioxide layer. FIG. 4B is an image showing the surface morphology of silicon dioxide layer formed on an aluminum oxide layer.

The images of FIGS. 4A and 4B are obtained by imaging a sample in which a silicon dioxide layer is formed alone and a sample in which a silicon dioxide layer formed on an aluminum oxide layer are formed by scanning electron microscopy (SEM).

The layer made of silicon dioxide alone has a porous surface structure, as can be seen from FIG. 4A, and the silicon dioxide layer formed on the aluminum oxide layer has a dense surface structure, as can be seen from FIG. 4A. When the surface of silicon dioxide layer is porous, the product is readily affected by external environmental factors and is readily broken by applied impact and readily corroded due to weak bonding when exposed to salt water. However, when the silicon dioxide layer has a dense structure, salt water do not readily permeate into the silicon dioxide layer and the product endures applied impact and exposure to salt water relatively well due to strong bonding between particles.

Hereinafter, anti-corrosion test results of the coating structure according to one embodiment of the present disclosure will be described with reference to FIGS. 5 and 6.

Figure 5:
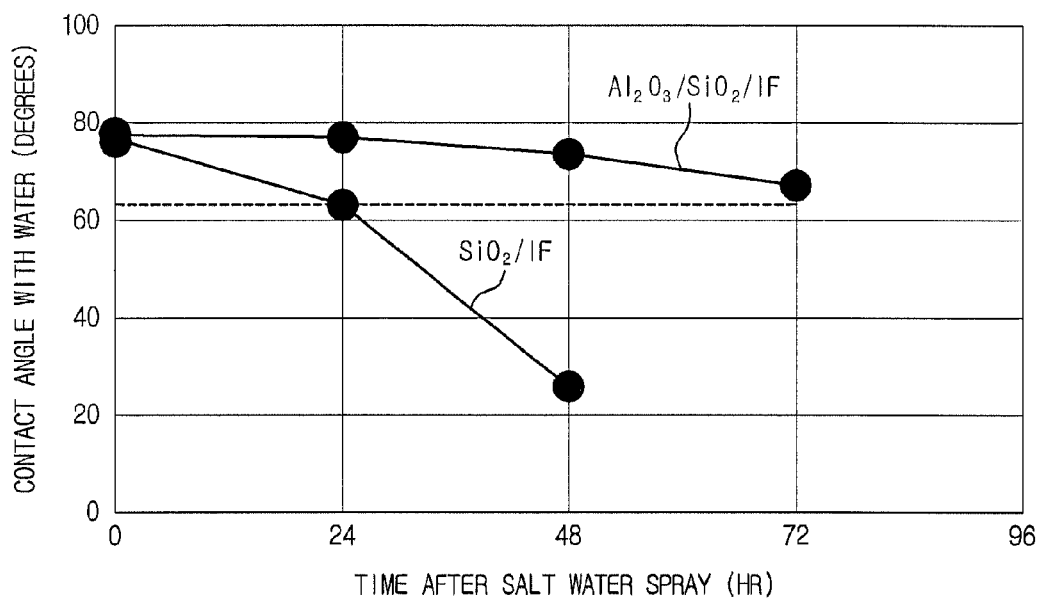
FIG. 5 is a graph showing the results obtained by spraying salt water onto the coating structure of FIG. 1 and the coating structure of FIG. 2 and measuring contact angles of coating composition layer over time.

A graph showing results obtained by spraying salt water to the coating structure of FIG. 1 and the coating structure of FIG. 2 and measuring contact angles of coating composition layer over time is illustrated in FIG. 5. The coating composition layer used herein is an anti-fingerprint coating composition layer to prevent adhesion or visibility of fingerprints.

In this test, a 5% sodium chloride (NaCl) solution is sprayed by salt water spraying to perform an anti-corrosion test and a contact angle between the anti-fingerprint coating layer and water was measured for 72 hours. The test temperature was 35° C.

A contact angle means a predetermined angle that is formed with a solid surface and a liquid surface when a liquid droplet maintains a predetermined lens shape on the horizontal surface of a solid, and the value thereof depends on the type of liquid and solid.

It can be seen from FIG. 5, in a case in which a silicon dioxide layer and an anti-fingerprint coating layer are formed alone, an initial contact angle of water to the anti-fingerprint coating layer gradually decreases over time and is decreased by 50 degrees or more 48 hours after salt water spraying, as compared to an initial contact angle before salt water spraying.

Also, it can be seen that when an aluminum oxide layer is formed on the surface of products and a silicon dioxide layer and an anti-fingerprint coating layer are then formed thereon, an initial contact angle of water to the anti-fingerprint coating layer is not greatly decreased and is decreased by about 10 degrees for 72 hours.

As a result, in a case in which only a silicon dioxide layer is formed on the surface of products and an anti-fingerprint coating layer is then formed thereon, when the coating layer is exposed to salt water, corrosion occurs and the coating layer is gradually removed, and in a case in which aluminum oxide is formed on the surface of products, and a silicon dioxide layer and an anti-fingerprint coating layer are then formed thereon, product shape can be maintained for a long period of time although the coating layer is exposed to salt water.

For failure mode analysis of salt water spray test, tests to measure the thickness of a sample in which the anti-fingerprint coating layer is removed from the coating structure of FIG. 1 and the silicon dioxide layer is formed alone, and a sample of FIG. 2 in which an anti-fingerprint coating layer has been removed from the coating structure, and an aluminum oxide layer and a silicon dioxide layer are formed in this order were performed.

In this test, a step was formed on the two samples and measured, a 5% sodium chloride (NaCl) solution was sprayed onto the samples at 35° C. and the step of two samples was measured after 72 hours to perform analysis.

Figure 6A:
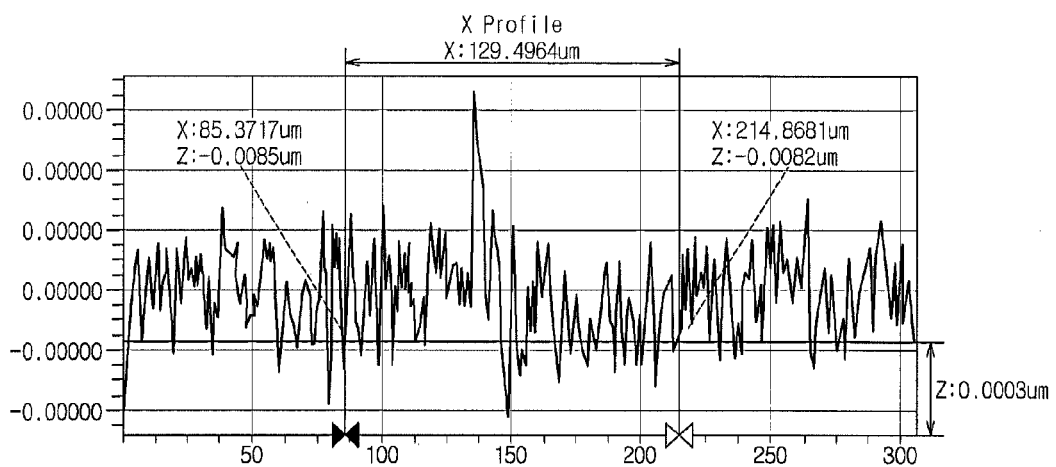
FIG. 6A is a graph showing analysis results of a sample in which only a silicon dioxide layer is formed.
Figure 6B:
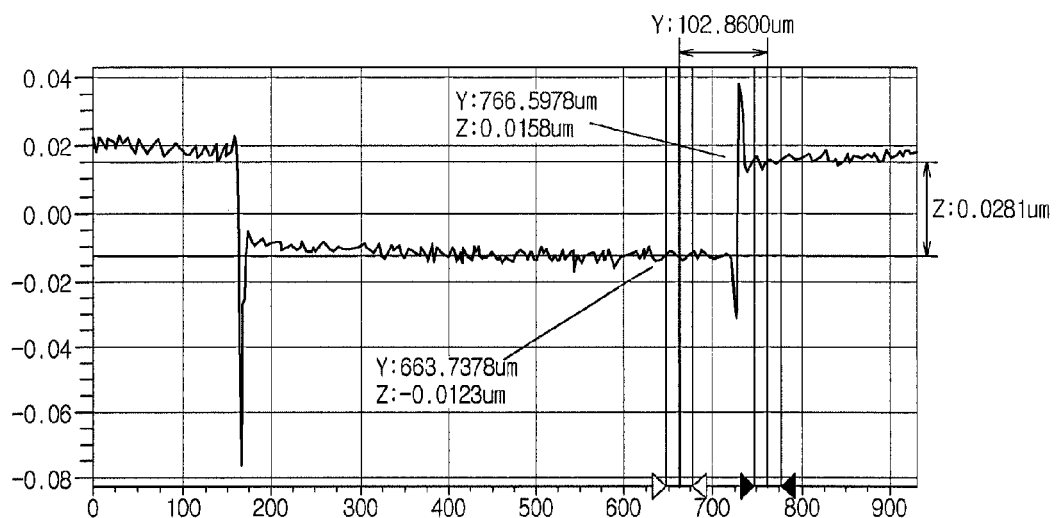
FIG. 6B is a graph showing analysis results of a sample in which an aluminum oxide layer and a silicon dioxide layer are formed in this order.

FIG. 6A is a graph showing analysis results of a sample in which only a silicon dioxide layer is formed and FIG. 6B is a graph showing analysis results of a sample in which an aluminum oxide layer and a silicon dioxide layer are formed in this order.

As can be seen from FIG. 6A, with respect to the sample in which only a silicon dioxide layer is formed, a step is not measured after salt water spraying. This means that the silicon dioxide layer of the sample is corroded and melted by sprayed salt water.

It can be seen from FIG. 6B, the sample in which an aluminum oxide layer and a silicon dioxide layer are formed in this order maintained the step. This means that the silicon dioxide layer of the sample is not corroded by sprayed salt water.

These results correspond to analysis results of surface morphology of samples described in FIG. 4. That is, the layer made of silicon dioxide alone is readily corroded upon exposure to salt water since it has a porous surface, and the silicon dioxide layer formed on the aluminum oxide layer alone is readily not corroded upon exposure to salt water and is maintained for a long period of time, since it has a dense surface structure.

The coating structure according to one embodiment of the present disclosure includes an aluminum oxide layer, a silicon dioxide layer and an anti-fingerprint coating layer. The material for the anti-fingerprint coating layer may be selected from waterproof and oilproof fluorine-containing thin films generally used for anti-fingerprint thin films, waterproof silicone resin skeleton-containing thin films and the like, but are not limited thereto. A variety of coating materials may be used depending on the application of products.

In addition, to prevent fingerprints on the coating layer from standing out, an invisible fingerprint (IF) coating composition may be used as the material for the anti-fingerprint coating layer. Hereinafter, the IF coating composition will be described in detail.

For reference, the term "anti-fingerprint" as used herein includes all of a property of preventing fingerprints from being left, a property of enabling easy cleaning of fingerprints and a property of concealing left fingerprints.

The IF coating composition that can be used as a material for the anti-fingerprint coating layer according to one embodiment of the present disclosure contains a silane oligomer having a $R_1$ group represented by Formula 1 of $[R_aO—(CH_2CH_2O)_p—R_b—]$ and a $R_2$ group represented by Formula 2 of $(R_c)_q$.

In Formula 1, $R_a$ is selected from the group consisting of hydrogen and an alkyl group having 1 to 3 carbon atoms in which the alkyl group is substituted or unsubstituted. In Formula 1, $R_b$ is selected from the group consisting of an alkyl group having 5 to 20 carbon atoms, an alkenyl group having 5 to 20 carbon atoms, an alkynyl group having 5 to 20 carbon atoms, an aryl group having 5 to 20 carbon atoms, an arylalkyl group having 6 to 20 carbon atoms, a cycloalkyl group having 5 to 20 carbon atoms and a heteroalkyl group having 5 to 20 carbon atoms. The reactive groups may be substituted or unsubstituted. In Formula 1, p is an integer of 1 to 12.

In Formula 2, $R_c$ is a cycloalkyl group having 3 to 20 carbon atoms, which may be substituted or unsubstituted. In Formula 2, q is an integer of 1 to 3.

In addition, when a weight ratio of two silane compounds and distilled water is 1:1:0.01 to 0.1, both anti-fingerprint properties and slip sensation are superior. However, the present disclosure is not limited to this weight ratio.

In addition, when the molecular weight of the silane oligomer exceeds 30,000, the silane oligomer becomes a gel and it is not easy to form thin films. Accordingly, in order to maintain a liquid phase, alkyl groups ($R_1$ and $R_2$) may be selected such that the molecular weight of the silane oligomer does not exceed 30,000, and when the molecular weight of silane oligomer is 100 to 30,000, a compound suitable for forming a thin film on the surface of a substrate can be obtained.

Silane is a type of silicon hydride, whose formula is represented by $Si_nH_{2n+2}$. A silane compound means a compound in which one or more hydrogen of $Si_nH_{2n+2}$ are substituted by other groups. Compounds with various properties may be obtained depending on the type of substituent.

The silane compound having an $R_1$ group and the silane compound having an $R_2$ group may be anti-fingerprint coating compositions that can prevent standing out of fingerprints without any treatment. When the surface of products is coated with the silane compound, superior anti-fingerprint properties are obtained, but an oligomer formed by mixing the two silane compounds enables formation of a coating composition with improved anti-fingerprint and slip properties.

In one embodiment, when the two silane compounds are mixed with distilled water ($H_2O$), hydrolysis in which reactive groups excluding $R_1$ and $R_2$ groups bonded to Si of the respective silane compounds are converted into hydroxyl groups (OH—) occurs and condensation between molecules then occurs to form a silane oligomer represented by the following Formula 3.

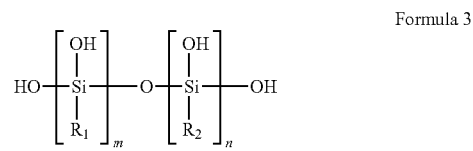

Formula 3

Any substance except distilled water ($H_2O$) may be used as a substance added to the silane compound so long as it causes condensation of the silane compound and thus forms a silane oligomer. For example, various acids are mixed with silane compounds to cause condensation and thereby form a silane oligomer.

When the reactive group bonded to Si is substituted by a hydroxyl group (—OH), as shown in Formula 3, it is easy to form a siloxane bond between the silane compound and the silicon dioxide layer and it is advantageous in terms of durability.

Hereinafter, characteristics of the coating structure of the present disclosure in which an anti-fingerprint coating layer is formed using the silane oligomer of Formula 3 will be described.

Figure 7:
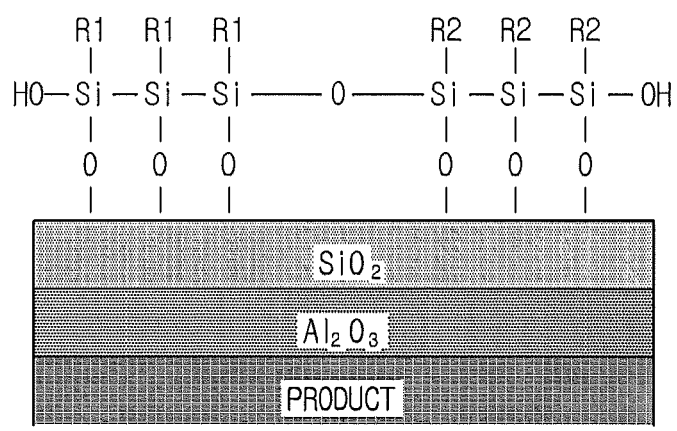
FIG. 7 is a view illustrating a phenomenon occurring when a silane compound of Formula 3 is coated on the silicon dioxide layer.

FIG. 7 is a view illustrating a phenomenon occurring when a silane compound of Formula 3 is coated on the silicon dioxide layer.

An aluminum oxide layer and a silicon dioxide layer are sequentially formed on the surface of a product, the silane compound having a $R_1$ group and an $R_2$ group of Formula 3 is coated on the silicon dioxide layer to form a thin film. At this time, the alkyl groups of $R_1$ and $R_2$ are arranged outside the surface of the silicon dioxide layer, the groups directly contact fingerprints. Accordingly, fingerprints left on the surface of thin films are concealed depending on alkyl groups of $R_1$ and $R_2$ as described below. A detailed description thereof will be given below.

The hydroxyl group opposite to the alkyl groups of $R_1$ and $R_2$ in Formula 3 forms a siloxane bond with the silicon dioxide layer through chemical reaction to provide superior durability.

Figure 8:
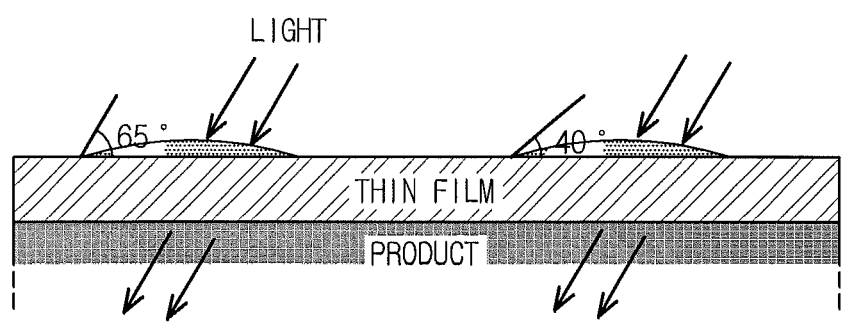
FIG. 8 shows a state in which light is reflected by water (H$_2$O) and diiodomethane present on the surface of thin film by the coating structure in which the anti-fingerprint coating layer is made of the silane compound of Formula 3 according to one embodiment of the present disclosure.

FIG. 8 shows a state in which light is reflected by water ($H_2O$) and diiodomethane present on the surface of thin films by the coating structure in which the anti-fingerprint coating layer is made of a silane compound of Formula 3 according to one embodiment of the present disclosure.

When light is irradiated to water and diiodomethane in which a contact angle therebetween is large, scattered reflection occurs, causing fingerprints to be remarkably visible by the naked eye. Accordingly, when fingerprint components containing water and diiodomethane are left on the surface having a large contact angle between water and diiodomethane, the fingerprints are remarkably visible and thus appear to be dirty.

When the silane compound of Formula 3 is used as a material for the anti-fingerprint coating layer in the coating structure according to one embodiment of the present disclosure, alkyl groups $R_1$ and $R_2$ are arranged outside and contact fingerprint components, as can be seen from FIG. 7.

The alkyl groups $R_1$ and $R_2$ have a contact angle to water of 60 to 80 degrees and a contact angle to diiodomethane of 45 degrees or less. Accordingly, water or diiodomethane left on the surface of the coating structure broadly spreads and light irradiated thereto passes though the substrate without being reflected, as shown in FIG. 8.

Accordingly, although fingerprint components containing water and diiodomethane are left on the thin film, they thinly spread on the surface of the coating structure and are thus not remarkably visible and do not appear to be dirty.

Hereinafter, a method for forming a coating structure according to one embodiment of the present disclosure will be described.

Figure 9:
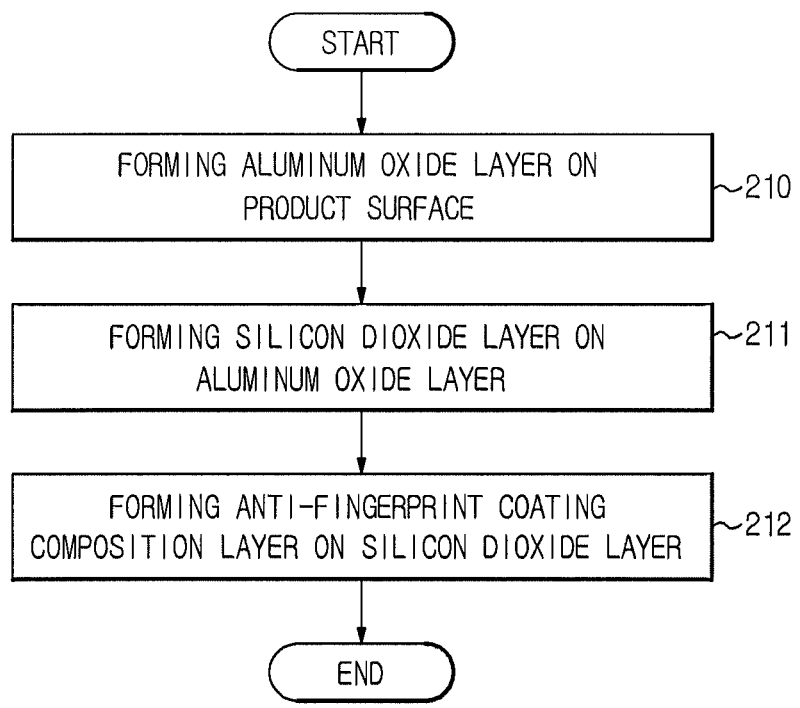
FIG. 9 is a flowchart briefly illustrating a method for forming a coating structure according to one embodiment of the present disclosure.

FIG. 9 is a flowchart briefly illustrating a method for forming a coating structure according to one embodiment of the present disclosure.

Referring to FIG. 9, a method for forming the coating structure according to one embodiment of the present disclosure includes forming an aluminum oxide layer on the surface of a product to be coated (210), forming a silicon dioxide layer on the aluminum oxide layer (211), and forming an anti-fingerprint coating composition layer on the silicon dioxide layer (212). As mentioned above, the coating layer formed on the silicon dioxide layer is not limited to the anti-fingerprint coating composition layer and may be selected from various coating layers.

Hereinafter, the method for forming the respective layers will be described in detail.

Figure 10A:
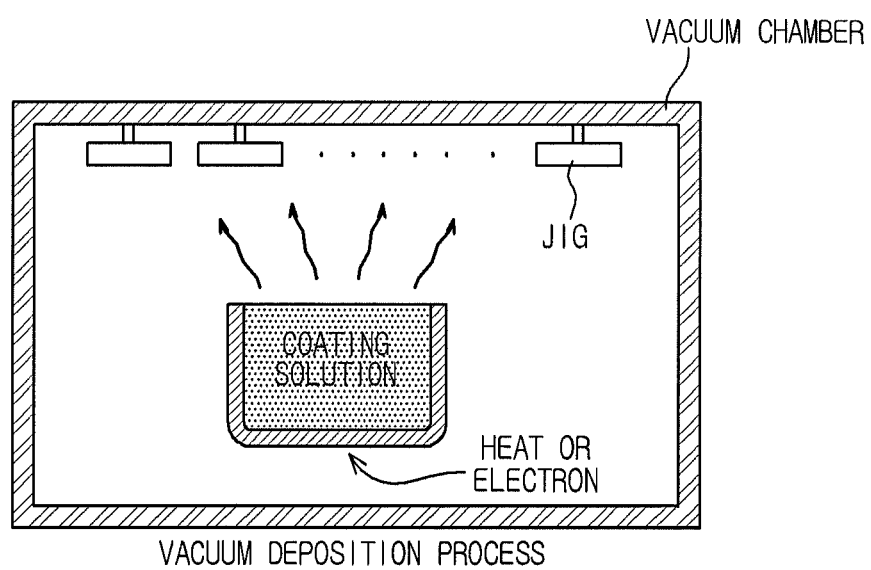
FIG. 10A illustrates a vacuum deposition process as one example of a dry process to form a thin film.
Figure 10B:
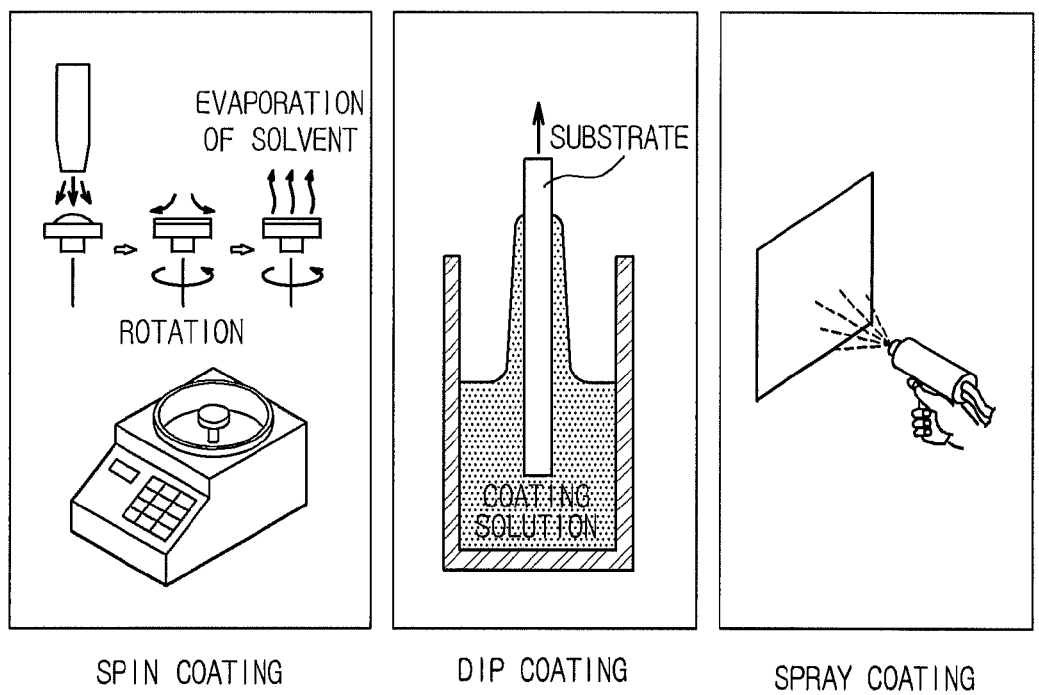
FIG. 10B illustrates examples of a wet process to form a thin film.

FIG. 10A illustrates a vacuum deposition process as one example of a dry process to form a thin film and FIG. 10B illustrates examples of a wet process to form a thin film.

Referring to FIG. 10A, vacuum deposition may be used as a dry process to form a thin film on the display or touch panel or the like of electronic products.

Vacuum deposition is a method for forming a thin film on the surface that faces an evaporation source by evaporating a metal or compound under vacuum. In one embodiment of vacuum deposition, a jig is arranged on a vacuum chamber, a substrate is mounted on the jig such that the surface of the substrate to be coated directs downward, a chamber or crucible containing a coating solution is arranged on the bottom of the chamber that faces the substrate and heat or an electron beam is applied thereto to allow the coating solution to evaporate. As a result, the evaporated coating solution is deposited on the surface of the substrate mounted on the jig to form a thin film. In addition, a solid such as metal instead of the coating solution may be sublimated by application of heat or an electron beam.

At this time, when the anti-fingerprint coating layer is formed using the IF coating composition described above, boiling point may be varied depending on the $R_1$ and $R_2$ groups and intensity of heat or the electron beam is determined in consideration of boiling point of the coating composition.

Referring to FIG. 10B, examples of a wet process to form a thin film on the surface of a substrate of electronic products using a solution-state coating composition include dip coating, spin coating and spray coating are illustrated.

Dip coating is a method in which a substrate for an electric product is dipped in a coating solution for a predetermined period of time and the material is separated therefrom to evaporate the solvent component. This method is generally used for coating substrates having an irregular surface, which depends on the substrate for the electronic product to be coated.

Spin coating is a method for forming thin films by spraying a coating solution on a rotating substrate, followed by drying and heating. This method is generally for forming thin films having a smaller thickness. Spin coating is a method for forming thin films based on the principle in which a liquid present on an object is forced out based on centrifugal force by rotating the object by a spin-coater. The coating material should be dissolved in a solvent or present in a liquid state.

Spray coating is a method for spraying a coating solution having a low viscosity through a spray nozzle. This method enables thin films to be uniformly formed even on substrates having an irregular or rough surface and uses a smaller amount of coating solution, as compared to dip coating, since the coating solution is applied only to one surface of the substrate and reduces energy required for evaporation.

Most preferably, the coating structure according to the present disclosure is coated by vacuum deposition. However, a dry- or wet-process other than vacuum deposition may be used.

Hereinafter, a method for forming a coating structure according to one embodiment of the present disclosure by vacuum deposition will be described in detail. The coating composition layer for forming the coating structure used herein is an anti-fingerprint coating composition layer.

Figure 11:
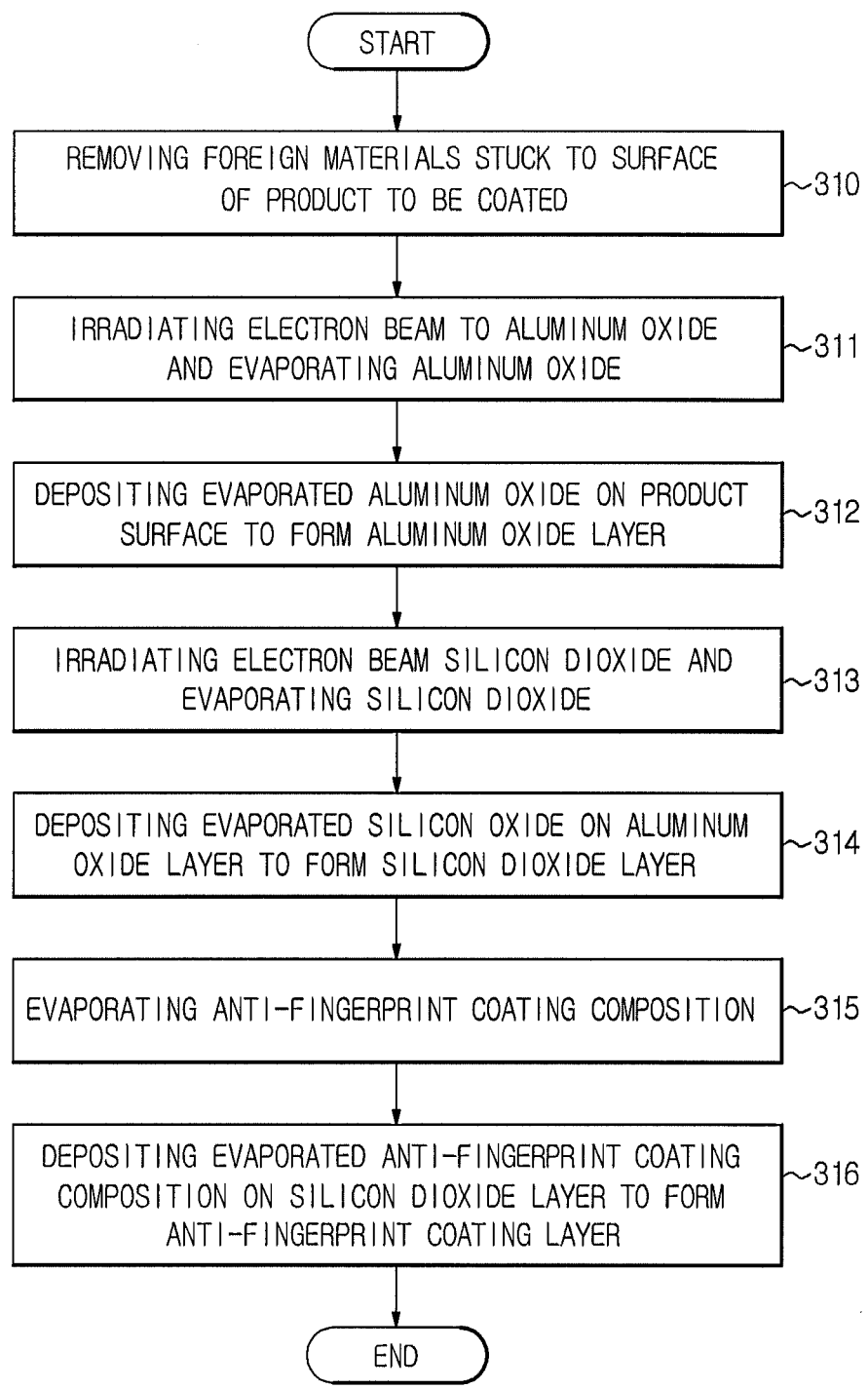
FIG. 11 is a flowchart illustrating a method forming the coating structure according to one embodiment of the present disclosure by vacuum deposition.

FIG. 11 is a flowchart illustrating a method for forming the coating structure according to one embodiment of the present disclosure by vacuum deposition.

Referring to FIG. 11, first, foreign materials or dirt stuck to the surface of the product to be coated are removed (310). At this time, either argon (Ar) plasma cleaning or ionization air blowing may be used. The product to be coated is arranged on a jig, is set using a magnet and subjected to ionized air blowing. As a result, foreign materials or moisture present on the surface thereof are sufficiently removed and the surface of the product is activated, thus facilitating deposition. Also, the product in which foreign materials are removed is mounted on a vacuum chamber and deposition conditions such as crucible position and deposition thickness are determined.

Aluminum oxide is incorporated into a crucible and a vacuum deposition machine is operated. As a result, an electron beam is irradiated to aluminum oxide and aluminum oxide is evaporated (311). The evaporated aluminum oxide is deposited on the product surface to form an aluminum oxide layer (312). At this time, the deposition thickness of aluminum oxide may be 100 to 200 Å.

After formation of the aluminum oxide layer, silicon dioxide and an anti-fingerprint coating composition are subjected to the same processes. Specifically, silicon dioxide is incorporated into a crucible and an electron beam is irradiated to silicon dioxide to evaporate silicon dioxide (313). The evaporated silicon dioxide is deposited on the aluminum oxide layer to form a silicon dioxide layer (314). At this time, the deposition thickness of the silicon dioxide layer may be 100 to 200 Å.

An anti-fingerprint coating composition is incorporated into a crucible and an electron beam is irradiated to the anti-fingerprint coating composition. As a result, the anti-fingerprint coating composition is evaporated (315). The evaporated anti-fingerprint coating composition is deposited on the silicon dioxide layer to form an anti-fingerprint coating layer (316). The anti-fingerprint coating composition may be an AF coating composition such as a fluorine or silicon-based substance or the IF coating composition described above. The anti-fingerprint coating composition used for embodiments of the present disclosure is not limited to the exemplified substances.

When an IF coating composition is used as the anti-fingerprint coating composition, a method for preparing the IF coating composition will be described in brief. The coating composition may be prepared by mixing silane compounds with distilled water since silane compounds and distilled water are liquids. However, in terms of preparation cost reduction, dilution in an organic solvent may be used. At this time, after the coating composition of Formula 3 is prepared by mixing two silane compounds with distilled water, the coating composition may be diluted in an organic solvent, or each of two silane compounds may be diluted in an organic solvent.

Useful organic solvents include alcohols such as methanol, ethanol, isopropanol, aliphatic hydrocarbons such as hexadecane, octane and hexane, cyclic hydrocarbons such as cyclohexane and cyclopentane, aromatic hydrocarbons such as toluene, xylene and benzene, organohalogen compounds such as carbon tetrachloride, chloroform and methylene chloride and the like. The organic solvents may be used alone or in combination thereof.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A coating structure formed on the surface of a product, comprising:
    an aluminum oxide ($Al_2O_3$) layer formed on the surface of the product;
    a silicon dioxide ($SiO_2$) layer formed on the surface of the aluminum oxide ($Al_2O_3$) layer; and
    a coating composition layer formed on the silicon dioxide ($SiO_2$) layer,
    wherein the coating composition comprises
        a silane oligomer having an $R_1$ group represented by Formula 1 of $[R_a O—(CH_2CH_2O)_p—R_b—]$ wherein $R_a$ is selected from the group consisting of hydrogen and an alkyl group having 1 to 3 carbon atoms; $R_b$ is selected from the group consisting of an alkyl group having 5 to 20 carbon atoms, an alkenyl group having 5 to 20 carbon atoms, an alkynyl group having 5 to 20 carbon atoms, an aryl group having 5 to 20 carbon atoms, an arylalkyl group having 6 to 20 carbon atoms, a cycloalkyl group having 5 to 20 carbon atoms and a heteroalkyl group having 5 to 20 carbon atoms; and p is an integer of 1 to 12; and
        an $R_2$ group represented by Formula 2 of $(R_c)_q$ wherein $R_c$ is a cycloalkyl group having 3 to 20 carbon atoms, and q is an integer of 1 to 3.

2. The coating structure according to claim 1, wherein the silicon dioxide ($SiO_2$) layer has a thickness of about 100 Å to about 200 Å.

3. The coating structure according to claim 1, wherein the $R_1$ group is at least one selected from the group consisting of a methoxyethoxyundecyl group, a methoxytriglycoloxy-undecyl group, a 3-methoxyethoxy-4-acetoxycyclohexylethyl group, a 16-(2-methoxy-ethoxy)hexadecyl group and derivatives thereof.

4. The coating structure according to claim 1, wherein the $R_2$ group is at least one selected from the group consisting of a 3-cyclopentadienylpropyl group, a dicyclopentyl group, a cyclopentyl group, a cyclohexyl group, a cyclooctyl group and derivatives thereof.

5. The coating structure according to claim 1, wherein the silane oligomer has a structure of Formula 3 below,

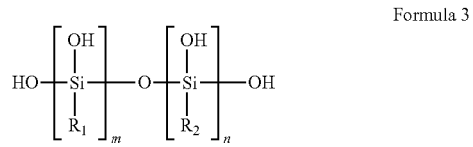

Formula 3 wherein m and n are each independently integers of 1 to 10.

6. The coating structure according to claim 1, wherein the aluminum oxide ($Al_2O_3$) layer has a thickness of about 50 Å to about 400 Å.

7. The coating structure according to claim 6, wherein the aluminum oxide ($Al_2O_3$) layer has a thickness of about 100 Å to about 200 Å.

8. A device provided at the surface thereof with a coating structure wherein the coating structure comprises:
    an aluminum oxide ($Al_2O_3$) layer formed on the surface of the device;
    a silicon dioxide ($SiO_2$) layer formed on the surface of the aluminum oxide (Al2O3) layer; and
    a coating composition layer formed on the silicon dioxide (SiO2) layer,
    wherein the coating composition comprises
        a silane oligomer having an $R_1$ group represented by Formula 1 of $[R_a O—(CH_2CH_2O)_p—R_b—]$ wherein $R_a$ is selected from the group consisting of hydrogen and an alkyl group having 1 to 3 carbon atoms; $R_b$ is selected from the group consisting of an alkyl group having 5 to 20 carbon atoms, an alkenyl group having 5 to 20 carbon atoms, an alkynyl group having 5 to 20 carbon atoms, an aryl group having 5 to 20 carbon atoms, an arylalkyl group having 6 to 20 carbon atoms, a cycloalkyl group having 5 to 20 carbon atoms and a heteroalkyl group having 5 to 20 carbon atoms; and p is an integer of 1 to 12; and
        an $R_2$ group represented by Formula 2 of $(R_c)_q$ wherein $R_c$ is a cycloalkyl group having 3 to 20 carbon atoms, and q is an integer of 1 to 3.

9. The device according to claim 8, wherein the aluminum oxide ($Al_2O_3$) layer has a thickness of about 50 Å to about 400 Å.

10. The device according to claim 9, wherein the aluminum oxide ($Al_2O_3$) layer has a thickness of about 100 Å to about 200 Å.

11. The device according to claim 10, wherein the silicon dioxide ($SiO_2$) layer has a thickness of about 100 Å to about 200 Å.

* * * * *

UNITED STATES PATENT AND TRADEMARK OFFICE
CERTIFICATE OF CORRECTION

PATENT NO. : 8,883,296 B2  
APPLICATION NO. : 13/371825  
DATED : November 11, 2014  
INVENTOR(S) : Byung Ha Park et al.

Page 1 of 1

It is certified that error appears in the above-identified patent and that said Letters Patent is hereby corrected as shown below:

On the Title Page

Column 1, Item [73] (Assignee), delete "Samsung Electro-Mechanics" and insert -- Samsung Electronics --, therefor.

In the Claims

Column 12, line 29, in Claim 8, delete "(Al203)" and insert -- $(Al_2O_3)$ --, therefor.
Column 12, line 31, in Claim 8, delete "(SiO2)" and insert -- $(SiO_2)$ --, therefor.

Signed and Sealed this
Second Day of June, 2015

Michelle K. Lee
*Director of the United States Patent and Trademark Office*